United States Patent
Dalton et al.

(10) Patent No.: US 7,526,698 B2
(45) Date of Patent: Apr. 28, 2009

(54) ERROR DETECTION AND CORRECTION IN SEMICONDUCTOR STRUCTURES

(75) Inventors: Timothy Joseph Dalton, Ridgefield, CT (US); Marc Raymond Faucher, South Burlington, VT (US); Paul David Kartschoke, Williston, VT (US); Peter Anthony Sandon, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 11/277,306

(22) Filed: Mar. 23, 2006

(65) Prior Publication Data

US 2007/0241398 A1 Oct. 18, 2007

(51) Int. Cl.
*G01R 31/28* (2006.01)
*G01R 31/02* (2006.01)

(52) U.S. Cl. .................. 714/733; 714/724; 324/763
(58) Field of Classification Search .............. 714/724, 714/733; 324/763
See application file for complete search history.

(56) References Cited

U.S. PATENT DOCUMENTS

| | | | | |
|---|---|---|---|---|
| 4,697,095 A * | 9/1987 | Fujii | ................. | 327/408 |
| 4,703,483 A * | 10/1987 | Enomoto et al. | ............ | 714/735 |
| 6,456,101 B2 * | 9/2002 | Dumbri | ................. | 324/763 |
| 6,489,791 B1 * | 12/2002 | Tsujii | ................. | 324/755 |
| 7,107,504 B2 * | 9/2006 | Sato et al. | ............ | 714/733 |
| 7,400,134 B2 * | 7/2008 | Morishita et al. | ....... | 324/158.1 |

* cited by examiner

*Primary Examiner*—James C Kerveros
(74) *Attorney, Agent, or Firm*—Schmeiser, Olsen & Watts; Michael J. LeStrange

(57) ABSTRACT

A semiconductor structure and a method for operating the same. The semiconductor structure includes a first semiconductor chip and a second semiconductor chip. The first semiconductor chip is on top of and bonded to the second semiconductor chip. The first and second semiconductor chips include a first and a second electric nodes. The second semiconductor chip further includes a first comparing circuit. The semiconductor structure further includes a first coupling via electrically connecting the first electric node of the first semiconductor chip to the first comparing circuit of the second semiconductor chip. The first comparing circuit is capable of (i) receiving an input signal from the second electric node directly, (ii) receiving an input signal from the first electric node indirectly through the first coupling via, and (iii) asserting a first mismatch signal in response to the input signals from the first and second electric nodes being different.

12 Claims, 7 Drawing Sheets

ERROR DETECTION AND CORRECTION IN SEMICONDUCTOR STRUCTURES

BACKGROUND OF THE INVENTION

1. Technical Field

The present invention relates to error detection and correction in semiconductor structures, and more specifically, to detect and correct errors that may occur in semiconductor devices using chip stacking.

2. Related Art

In the prior art, error detection and correction for semiconductor devices can be made by using identical semiconductor chips on a same printed wire board in which the identical semiconductor chips are connected together via the printed wires on the board. However the number of signals that can be compared (checked) is limited by the number of pins of the semiconductor chip. Therefore, there is a need for a semiconductor chip (and method for operating the same) in which the number of signals that can be compared is not limited by the number of the pins on the semiconductor chip.

SUMMARY OF THE INVENTION

The present invention provides a semiconductor structure, comprising (a) a first semiconductor chip and a second semiconductor chip, wherein the first semiconductor chip is on top of and bonded to the second semiconductor chip, wherein the first semiconductor chip comprises a first electric node, wherein the second semiconductor chip comprises a second electric node, and wherein the second semiconductor chip further comprises a first comparing circuit; and (b) a first coupling via electrically connecting the first electric node of the first semiconductor chip to the first comparing circuit of the second semiconductor chip, wherein the first comparing circuit is capable of: (i) receiving an input signal from the first electric node indirectly through the first coupling via, (ii) receiving an input signal from the second electric node directly, and (iii) asserting a first mismatch signal in response to the input signals from the first and second electric nodes being different.

The present invention also provides a semiconductor structure, comprising (a) a first semiconductor chip, a second semiconductor chip, and a first error checking layer, wherein the first error checking layer is sandwiched between and bonded to the first and second semiconductor chips, wherein the first semiconductor chip comprises a first electric node, wherein the second semiconductor chip comprises a second electric node, wherein the first error checking layer comprises a first comparing circuit; (b) a first coupling via electrically connecting the first electric node of the first semiconductor chip to the first comparing circuit of the first error checking layer; and (c) a second coupling via electrically connecting the second electric node of the second semiconductor chip to the first comparing circuit of the first error checking layer, wherein the first comparing circuit is capable of: (i) receiving an input signal from the first electric node indirectly through the first coupling via, (ii) receiving an input signal from the second electric node indirectly through the second coupling via, and (iii) asserting a first mismatch signal in response to the input signals from the first and second electric nodes being different.

The present invention provides a semiconductor structure operation method, comprising providing a semiconductor structure which includes: (a) a first semiconductor chip and a second semiconductor chip, wherein the first semiconductor chip is on top of and bonded to the second semiconductor chip, wherein the first semiconductor chip comprises a first electric node, wherein the second semiconductor chip comprises a second electric node, and wherein the second semiconductor chip further comprises a first comparing circuit, and (b) a first coupling via electrically connecting the first electric node of the first semiconductor chip to the first comparing circuit of the second semiconductor chip; and using the first comparing circuit to: (a) receive an input from the second electric node directly, (b) receive an input from the first electric node indirectly through the first coupling via, and (c) assert a first mismatch signal in response to signals on the first and second electric nodes being different The present invention provides the structure (and method for operating the same) in which the number of signals that can be compared are not limited by the number of the pins on the semiconductor chip.

DETAILED DESCRIPTION OF THE INVENTION

Figure 1A:
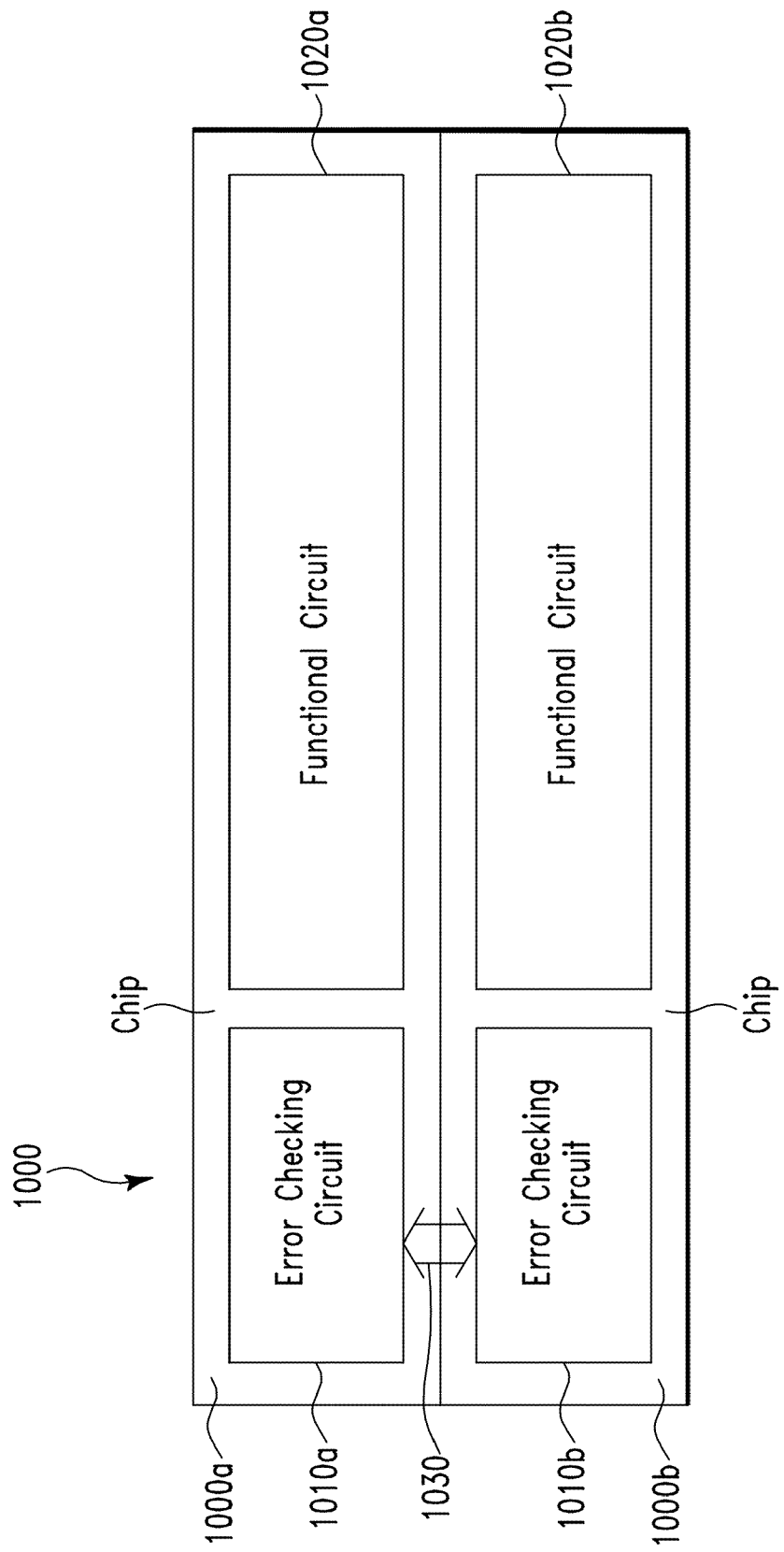
FIGS. 1A-1C illustrate a first digital system, in accordance with embodiments of the present invention.
Figure 1B:
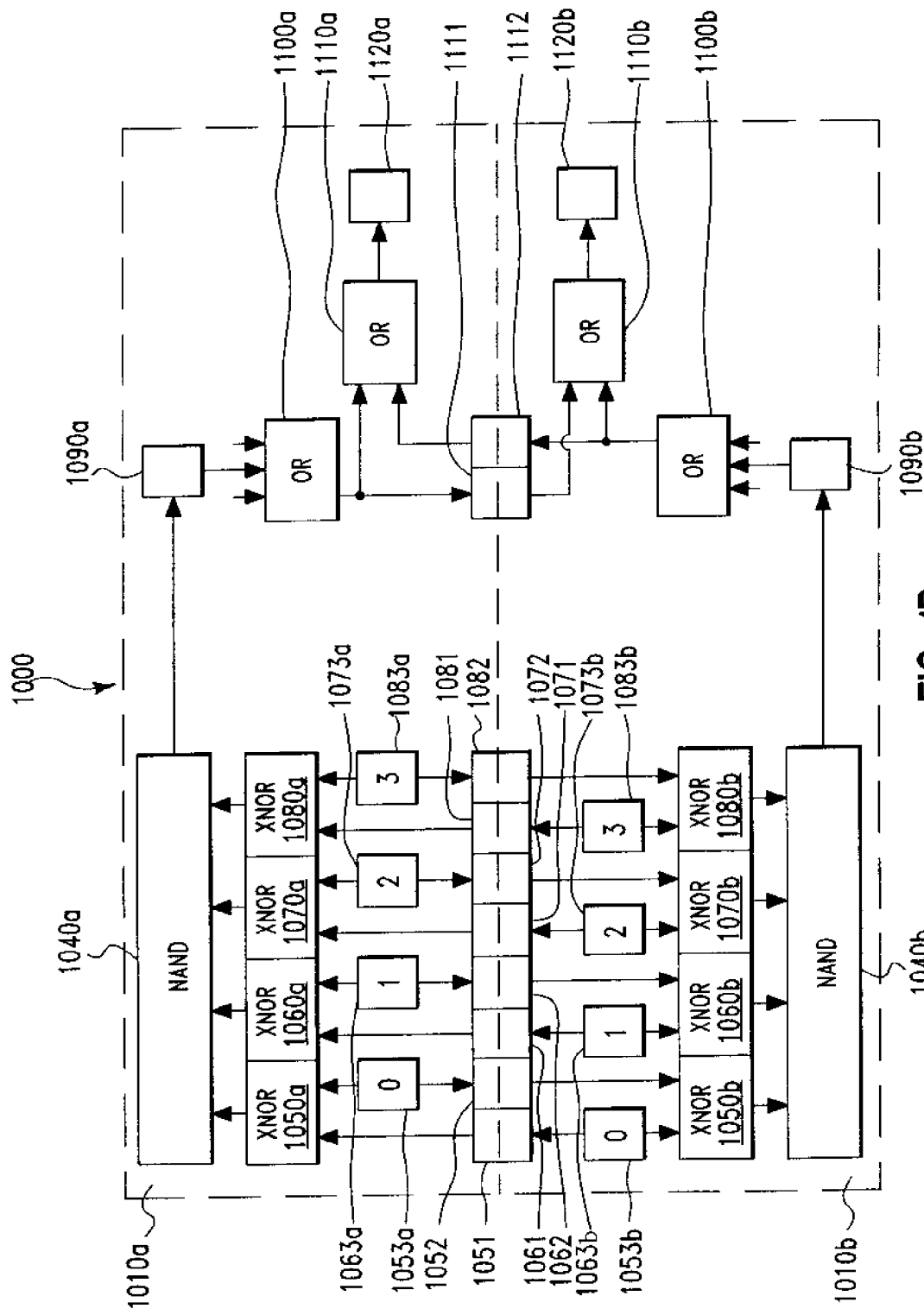
Figure 1C:
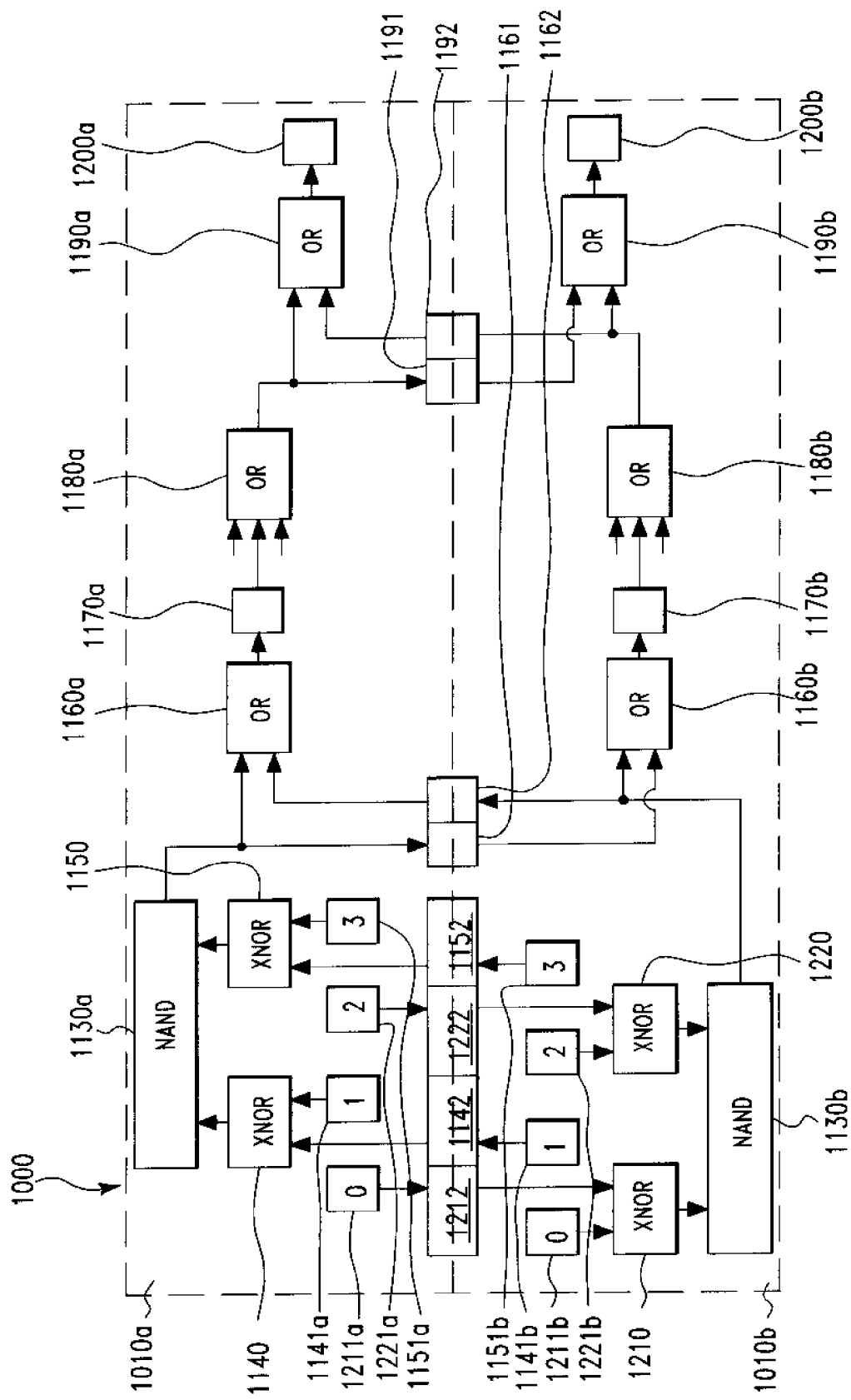

FIGS. 1A-1C illustrate a first digital system 1000, in accordance with embodiments of the present invention. In one embodiment, more specifically, FIG. 1A illustrates a cross section view of the first digital system 1000 comprising a first semiconductor chip 1000a and a second semiconductor chip 1000b. The first semiconductor chip 1000a is on top and bonded to the second semiconductor chip 1000b. Illustratively, the first semiconductor chip 1000a comprises a first error checking circuit 1010a and a first functional circuit 1020a. Similarly, the second semiconductor chip 1000b comprises a second error checking circuit 1010b and a second functional circuit 1020b. In one embodiment, components of the first error checking circuit 1010a are dispersed among components of the first functional circuit 1020a. Similarly, components of the second error checking circuit 1010b are dispersed among components of the second functional circuit 1020b. However, for simplicity, the first and second error checking circuits 1010a and 1010b are shown separate from the first and second functional circuits 1020a and 1020b. In one embodiment, coupling vias 1030 are formed between the first and second error checking circuits 1010a and 1010b to transmit checking logic signals between the first and second error checking circuits 1010a and 1010b.

FIG. 1B illustrates a first embodiment of the first and second error checking circuits 1010a and 1010b and the coupling vias 1030 of FIG. 1A. In one embodiment, more specifically, the first error checking circuit 1010a comprises a first NAND circuit 1040a, four exclusive-NOR circuits 1050a, 1060a, 1070a and 1080a, two OR circuits 1100a and 1110a, a first local error latch 1090a, and a first master error latch 1120a. Similarly, in one embodiment, the second error checking circuit 1010b comprises a second NAND circuit 1040b, four exclusive-NOR circuits 1050b, 1060b, 1070b and 1080b, two OR circuits 1100b and 1110b, a second local error latch 1090b and a second master error latch 1120b. The first and second error checking circuits 1010a and 1010b are used to identify any mismatch between any pair of four functional latches pairs 1053a and 1053b, 1063a and 1063b, 1073a and 1073b, 1083a and 1083b. In one embodiment, the coupling vias 1030 comprise ten coupling vias 1051, 1052, 1061, 1062, 1071, 1072, 1081, 1082, 1111, and 1112.

In one embodiment, the exclusive-NOR circuits 1050a, 1060a, 1070a, and 1080a receive as inputs (i) from the functional latches 1053a, 1063a, 1073a, and 1083a directly and (ii) from the functional latches 1053b, 1063b, 1073b, and 1083b indirectly through the vias 1051, 1061, 1071, and 1081, respectively. Similarly, the exclusive-NOR circuits 1050b, 1060b, 1070b, and 1080b receive as inputs (i) from the functional latches 1053b, 1063b, 1073b, and 1083b directly and (ii) from the functional latches 1053a, 1063a, 1073a, and 1083a indirectly through the vias 1052, 1062, 1072, and 1082, respectively.

In one embodiment, outputs of the first and second NAND circuits 1040a and 1040b are connected to the first and second local error latches 1090a and 1090b, respectively. In one embodiment, the OR circuits 1100a and 1100b have only 3 inputs, but it should be understood that there may be any number of inputs from any number of local error latches. In one embodiment, the OR-circuit 1110a receives as inputs (i) from the output of the OR-circuit 1100a directly and (ii) from the output of the OR-circuit 1100b indirectly through the via 1112. Similarly, the OR-circuit 1110b receives as inputs (i) from the output of the OR-circuit 1100b directly and (ii) from the output of the OR-circuit 1100a indirectly through the via 1111.

In one embodiment, the first and the second functional circuits 1020a and 1020b (FIG. 1A) are functionally identical and are operated in lock step which means they are controlled by a same clock signal synchronously. As a result, the contents of the functional latch pairs 1053a and 1053b, 1063a and 1063b, 1073a and 1073b, 1083a and 1083b are supposed to be the same. If a mismatch in any of the four functional latch pairs occurs, then a 1 will be generated and sent to the first and second local error latches 1090a and 1090b. The contents of the first and second local error latches 1090a and 1090b will be sent respectively to the first and second master error latches 1120a and 1120b to indicate the mismatch.

FIG. 1C illustrates a second embodiment of the first and second error checking circuits 1010a and 1010b and the coupling vias 1030 of FIG. 1A. In one embodiment, more specifically, the first error checking circuit 1010a comprises a first NAND circuit 1130a, two exclusive-NOR circuits 1140 and 1150, three OR circuits 1160a, 1180a and 1190a, a first local error latch 1170a and a first master error latch 1200a. Similarly, in one embodiment, the second error checking circuit 1010b comprises a second NAND circuit 1130b, two exclusive-NOR circuits 1210 and 1220, three OR circuits 1160b, 1180b and 1190b, a second local error latch 1170b and a second master error latch 1200b. The first and second error checking circuits 1010a and 1010b are used to identify any mismatch between any pair of four functional latches pairs 1141a and 1141b, 1151a and 1151b, 1211a and 1211b, 1221a and 1221b. In one embodiment, the coupling vias 1030 comprise eight coupling vias 1212, 1222, 1142, 1152, 1161, 1162, 1191, and 1192.

In one embodiment, the exclusive-NOR circuits 1140 and 1150 receive as inputs (i) from the functional latches 1141a and 1151a directly and (ii) from the functional latches 1141b and 1151b indirectly through the vias 1142 and 1152, respectively. Similarly, the exclusive-NOR circuits 1210 and 1220 receive as inputs (i) from the functional latches 1211b and 1221b directly and (ii) from the functional latches 1211a and 1221a indirectly through the vias 1212 and 1222, respectively.

In one embodiment, the OR circuit 1160a receives as inputs (i) from the output of the NAND circuit 1130a directly and (ii) from the output of the NAND circuit 1130b indirectly through the via 1162. Similarly, the OR circuit 1160b receives as inputs (i) from the output of the NAND circuit 1130b directly and (ii) from the output of the NAND circuit 1130a indirectly through the via 1161. In one embodiment, outputs of the OR circuits 1160a and 1160b are connected to the first and second local error latches 1170a and 1170b, respectively. For simplicity, in FIG. 1C, the OR circuits 1180a and 1180b have only 3 inputs, but it should be understood that there may be any number of inputs from any number of local error latches. The OR circuit 1190a receives as inputs (i) from the output of the OR circuit 1180a directly and (ii) from the output of the OR circuit 1180b indirectly through the via 1192. Similarly, the OR circuit 1190b receives as inputs (i) from the output of the OR circuit 1180b directly and (ii) from the output of the OR circuit 1180a indirectly through the via 1191.

In one embodiment, the first and second functional circuits 1020a and 1020b (FIG. 1A) are functionally identical and are operated in lock step, which means they are controlled by a same clock signal synchronously. As a result, the contents of the functional latch pairs 1141a and 1141b, 1151a and 1151b, 1211a and 1211b, 1221a and 1221b are supposed to be the same. If a mismatch in any of the four functional latch pairs occurs, then a 1 will be generated and sent to the first or second local error latch 1170a or 1170b. The contents of the first and second local error latches 1170a and 1170b will be sent respectively to the first and second master error latches 1200a and 1200b to indicate the mismatch.

Figure 2:
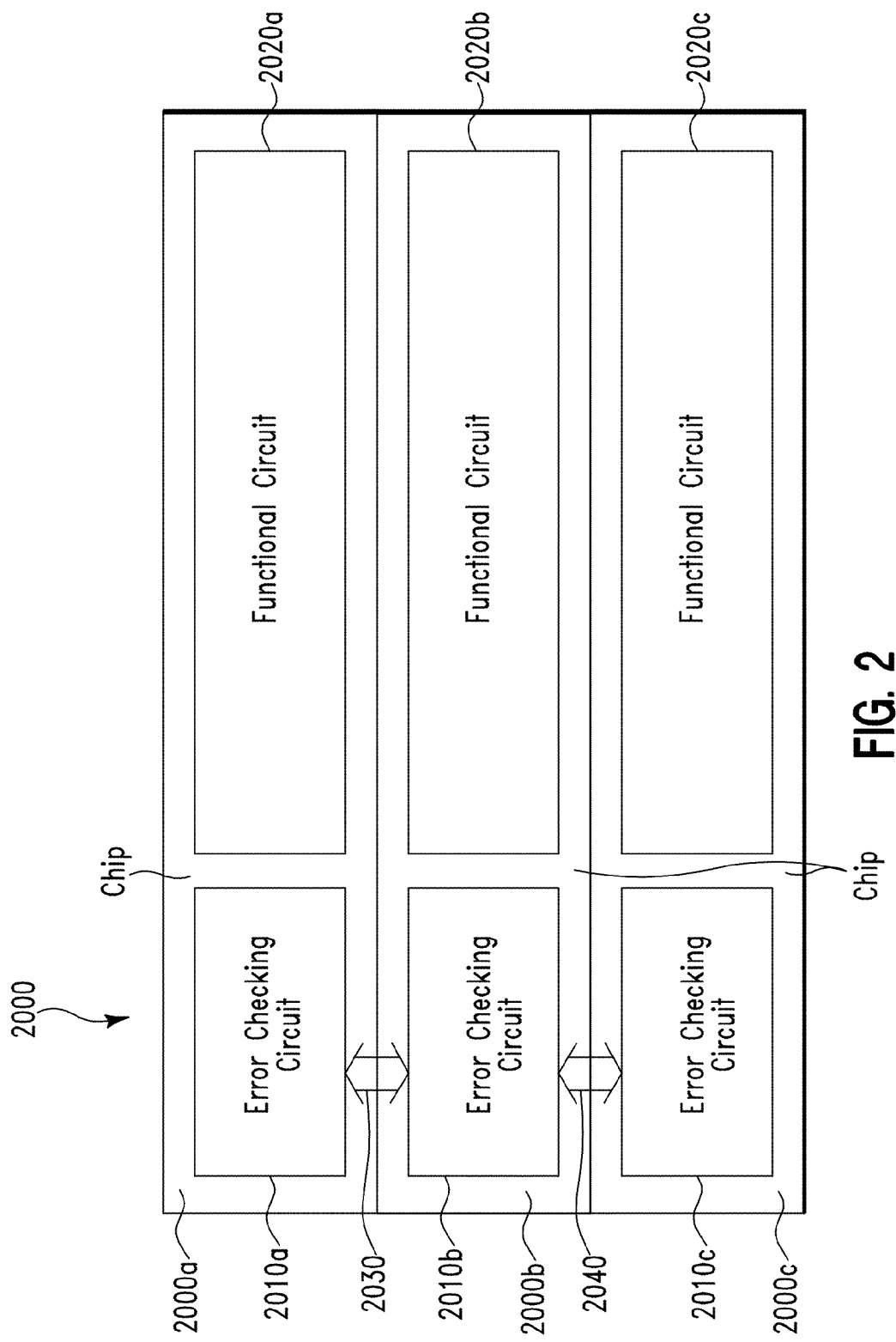
FIG. 2 illustrates a cross section view of a second digital system, in accordance with embodiments of the present invention.

FIG. 2 illustrates a second digital system 2000, in accordance with embodiments of the present invention. In one embodiment, more specifically, FIG. 2 illustrates a cross section view of the second digital system 2000 which comprises a first semiconductor chip 2000a, a second semiconductor chip 2000b, and a third semiconductor chip 2000c. The first semiconductor chip 2000a is on top and bonded to the second semiconductor chip 2000b. The second semiconductor chip 2000b is on top and bonded to the third semiconductor chip 2000c. Illustratively, the first semiconductor chip 2000a comprises a first error checking circuit 2010a and a first functional circuit 2020a. Similarly, the second semiconductor chip 2000b comprises a second error checking circuit 2010b and a second functional circuit 2020b. Similarly, the third semiconductor chip 2000c comprises a third error checking circuit 2010c, and a third functional circuit 2020c. In one embodiment, components of the first error checking circuit 2010a are dispersed among components of the first functional circuit 2020a. Similarly, components of the second error checking circuit 2010b are dispersed among components of the second functional circuit 2020b. Similarly, components of the third error checking circuit 2010c are dispersed among components of the third functional circuit 2020c. However, for simplicity, the first, second and third error checking circuits 2010a, 2010b, and 2010c are shown separate from the first, second and third functional circuits 2020a, 2020b, and 2020c. In one embodiment, coupling vias 2030 are formed between the first and second error checking circuits 2020a and 2020b, coupling vias 2040 are formed between the second and third error checking circuits 2020b and 2020c to transmit checking logic signals among the first, second, and third error checking circuits 2010a, 2010b, and 2010c.

In one embodiment, the first, second, and third error checking circuits 2010a, 2010b, and 2010c of the second digital system 2000 have components similar to those of the first and second error checking circuits 1010a and 1010b of the first digital system 1000 (FIG. 1A).

In one embodiment, the first, second, and third functional circuits 2020a, 2020b, and 2010c are functionally identical and are operated in lock step which means they are controlled by a same clock signal synchronously. As a result, the contents of any three corresponding functional latches in the first, second and third functional circuits 2020a, 2020b, and 2020c are supposed to be the same. If a mismatch in the three functional latches occurs, then a 1 will be generated and sent to the master error latches (not shown) on the first, second, and third error checking circuits 2010a, 2010b, and 2010c to indicate the mismatch. In one embodiment, the second error checking circuit 2010b comprises a conventional voting logic (not shown), which generates an output equal to the majority content of the three functional latches. For example, if two of the three functional latches (not shown) contain a 1 and the third functional latch (not shown) contains a 0, then the conventional voting logic (not shown) will generate a 1, which is the majority content of the three latches. This value can then be used to correct the value in the miscomparing latch, allowing computation to proceed without further intervention.

Figure 3A:
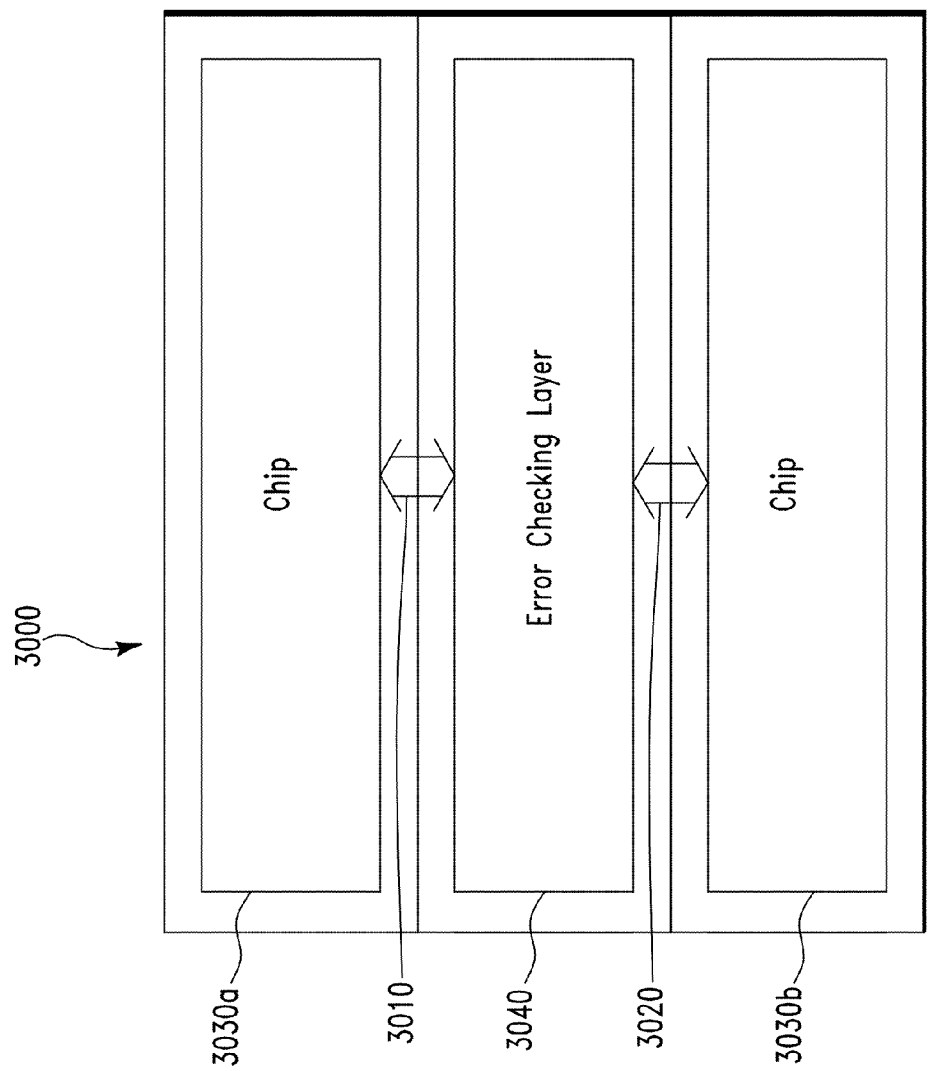
FIGS. 3A-3B illustrates a cross section view of a third digital system, in accordance with embodiments of the present invention.
Figure 3B:
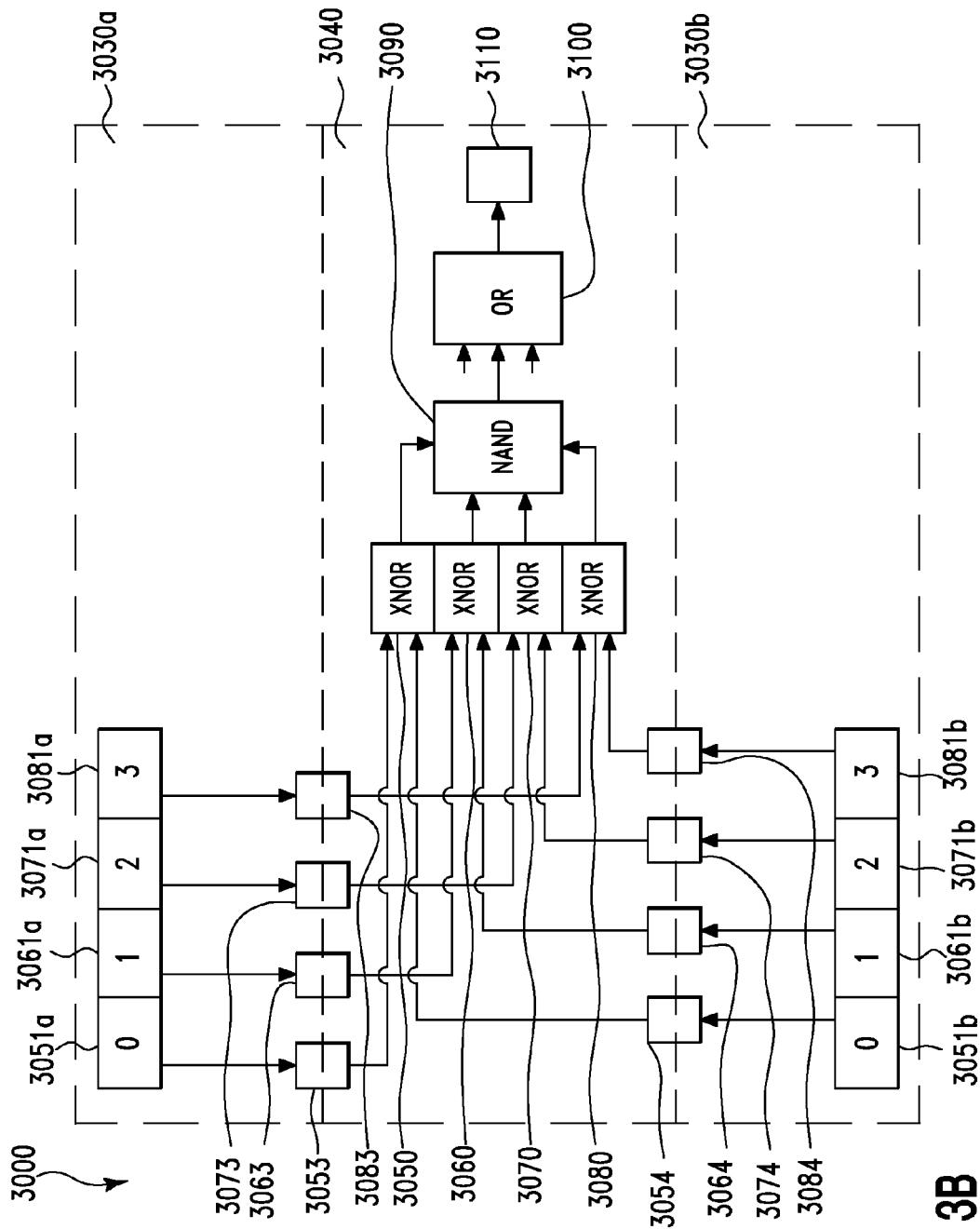

FIGS. 3A-3B illustrates a third digital system 3000, in accordance with embodiments of the present invention. In one embodiment, more specifically, FIG. 3A illustrates a cross section view of the third digital system 3000 which comprises a first semiconductor chip 3030a, a second semiconductor chip 3030b, and an error checking layer 3040 sandwiched between the first and second functional circuits 3030a and 3030b. Illustratively, the error checking layer 3040 comprises all error-checking functions needed for error detection of the entire third digital system 3000. In one embodiment, coupling vias 3010 are formed between the first semiconductor chip 3030a and the error checking layer 3040, coupling vias 3020 are formed between the second semiconductor chip 3030b and the error checking layer 3040 to transmit checking logic signals from the first and second functional circuits 3030a and 3030b to the error checking circuit 3040.

FIG. 3B illustrates a third embodiment of the first and second functional circuits 3030a and 3030b, the error checking layer 3040, and the coupling vias 3010 and 3020 of FIG. 3A. In one embodiment, more specifically, the first semiconductor chip 3030a comprises four functional latches 3051a, 3061a, 3071a, and 3081a. Similarly, the second semiconductor chip 3030b comprises four functional latches 3051b, 3061b, 3071b, and 3081b. The error checking layer 3040 comprises a NAND circuit 3090, four exclusive-NOR circuits 3050, 3060, 3070 and 3080, an OR circuit 3100, and a master error latch 3110. The error checking layer 3040 is used to identify any mismatch between any pair of four functional latches pairs 3051a and 3051b, 3061a and 3061b, 3071a and 3071b, 3081a and 3081b. In one embodiment, the coupling vias 3010 comprise four coupling vias 3053, 3063, 3073, and 3083, whereas the coupling vias 3020 comprise four coupling vias 3054, 3064, 3074, and 3084.

In one embodiment, the exclusive-NOR circuits 3050, 3060, 3070, and 3080 receive as inputs (i) from the functional latches 3051a, 3061a, 3071a, and 3081a indirectly through the via 3053, 3063, 3073, and 3083 and (ii) from the functional latches 3051b, 3061b, 3071b, and 3081b indirectly through the via 3054, 3064, 3074, and 3084, respectively. The outputs of the exclusive-NOR circuits 3050, 3060, 3070, and 3080 are the inputs of the NAND circuit 3090. The OR circuit 3100 receives as inputs from many NAND circuits which are similar to the NAND circuit 3090. The output of the OR circuit 3100 is connected to the master error latch 3110 whose output (not shown) is reported back to the first and second semiconductor chips 3030a and 3030b, using coupling vias (not shown).

In one embodiment, the first semiconductor chip 3030a and the second semiconductor chip 3030b are functionally identical and are operated in lock step which means they are controlled by a same clock signal synchronously. As a result, the contents of the functional latch pairs 3051a and 3051b, 3061a and 3061b, 3071a and 3071b, 3081a and 3082b are supposed to be the same. If a mismatch in any of the four functional latch pairs occurs, then a 1 will be generated and sent to the master error latch 3110 to indicate the mismatch.

Figure 4:
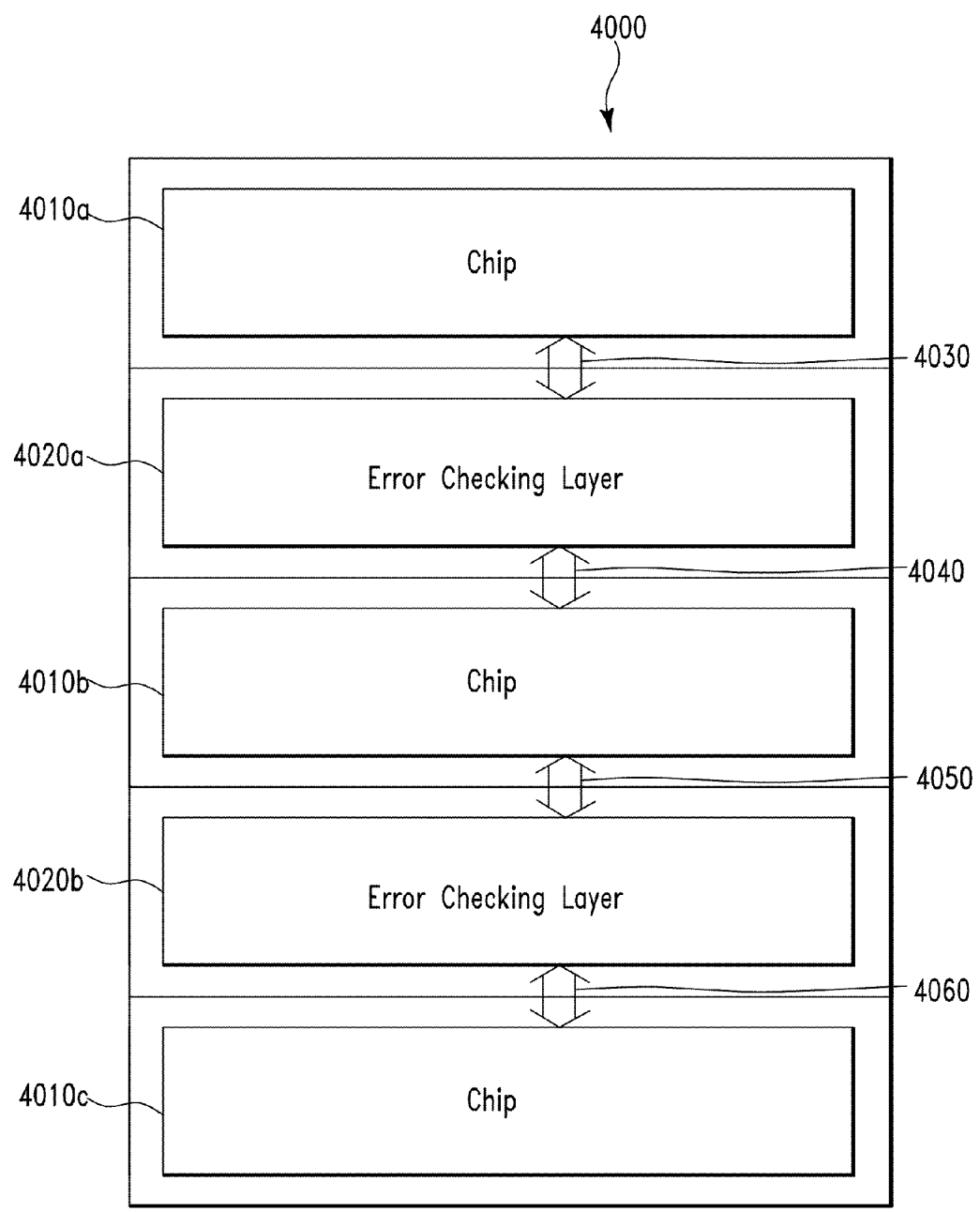
FIG. 4 illustrates a cross section view of the fourth digital system, in accordance with embodiments of the present invention.

FIG. 4 illustrates a fourth digital system 4000, in accordance with embodiments of the present invention. In one embodiment, more specifically, FIG. 4 illustrates a cross section view of the fourth digital system 4000 which comprises a first semiconductor chip 4010a, a second semiconductor chip 4010b, a third semiconductor chip 4010c, a first error checking layer 4020a sandwiched between the first and second functional circuits 4010a and 4010b, and a second error checking layer 4020b sandwiched between the second and third functional circuits 4010b and 4010c. Illustratively, the first and second checking logic layers 4020a and 4020b comprise all the error checking circuits needed for error detection of the entire fourth digital system 4000. In one embodiment, coupling vias 4030, 4040 and 4050, 4060 are formed between the first semiconductor chip 4010a and the first error checking layer 4020a, the first error checking layer 4020a and second semiconductor chip 4010b, the second semiconductor chip 4010b and the second error checking layer 4020b, the second error checking layer 4020b and third semiconductor chip 4010c, respectively to transmit checking logic signals among the first, second, and third functional circuits 4010a, 4010b, and 4010c and the first and second checking logic layer 4020a, and 4020b.

In one embodiment, the first and second error checking logic layers 4020a and 4020b of the fourth digital system 4000 have components similar to those of the error checking layer 3040 of the third digital system 3000 (FIG. 3A).

In one embodiment, the first, second, and third semiconductor chips 4010a, 4010b, and 4010c are functionally identical and are operated in lock step which means they are controlled by a same clock signal synchronously. As a result, the contents of the corresponding functional latches in the first, second and third functional circuits 4011, 4012, and 4013 are supposed to be the same. If a mismatch in any of the three functional latch triplet occurs, then a 1 will be generated and sent to the master error latches (not shown) in the first and the second error checking circuits 4020a and 4020b to indicate the mismatch. In one embodiment, the first error checking layer comprises a conventional voting logic (not shown), which generates an output equal to the majority content of the three functional latches. For example, if two of the three functional latches (not shown) contain a 1 and the third functional latch (not shown) contains a 0, then the conventional voting logic will generate a 1, which is the majority content of the three latches.

In the embodiments described above, 2-way and 3-way redundancies for error checking and correction are shown and described. In general, N-way redundancies for error checking and correction can be done in a similar manner, wherein N is an integer greater than 2. In the higher redundancy cases, the voting method previously described is only one of several methods of error correction that could be implemented within the structures described here.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
    (a) a first semiconductor chip and a second semiconductor chip,
        wherein the first semiconductor chip is on top of and bonded to the second semiconductor chip,
        wherein the first semiconductor chip comprises a first functional circuit including a first latch,
        wherein the second semiconductor chip comprises a second functional circuit including a second latch,
        wherein the first and second functional circuits are functionally identical, and
        wherein the second semiconductor chip further comprises a first comparing circuit electrically connected to the second latch; and
    (b) a first coupling via electrically connecting the first latch of the first semiconductor chip to the first comparing circuit of the second semiconductor chip,
    wherein the first comparing circuit is configured to:
        (i) receive a first content of the first latch indirectly through the first coupling via,
        (ii) receive a second content of the second latch directly, and
        (iii) compare the first and second contents and assert a first mismatch signal in response to the first and second contents being different.

2. The structure of claim 1, further comprising a second coupling via,
    wherein the first semiconductor chip further comprises a third latch in the first functional circuit,
    wherein the second semiconductor chip further comprises a fourth latch in the second functional circuit,
    wherein the second semiconductor chip further comprises a second comparing circuit electrically connected to the fourth latch,
    wherein the second coupling via electrically connects the third latch of the first semiconductor chip to the second comparing circuit of the second semiconductor chip, and
    wherein the second comparing circuit is configured to:
        (i) receive a third content of the third latch indirectly through the second coupling via,
        (ii) receive a fourth content of the fourth latch directly, and
        (iii) compare the third and fourth contents and assert a second mismatch signal in response to the third and fourth contents being different.

3. The structure of claim 2,
    wherein the second semiconductor chip further comprises a transferring circuit, and
    wherein the transferring circuit is configured to assert a local error signal in response to either the first comparing circuit asserting the first mismatch signal or the second comparing circuit asserting the second mismatch signal.

4. The structure of claim 3,
    wherein the first comparing circuit comprises a first exclusive-NOR circuit,
    wherein the second comparing circuit comprises a second exclusive-NOR circuit, and
    wherein the transferring circuit comprises a NAND-circuit.

5. The structure of claim 4, further comprising a third coupling via,
    wherein the first semiconductor chip further comprises a fifth latch in the first functional circuit,
    wherein the second semiconductor chip further comprises a sixth latch in the second functional circuit,
    wherein the first semiconductor chip further comprises a third comparing circuit electrically connected to the fifth latch,
    wherein the third coupling via electrically connects the sixth latch of the second semiconductor chip to the third comparing circuit of the first semiconductor chip, and
    wherein the third comparing circuit is configured to:
        (i) receive a fifth content of the fifth latch directly,
        (ii) receive a sixth content of the sixth latch indirectly through the third coupling via, and
        (iii) compare the fifth and sixth contents and assert a third mismatch signal in response to the fifth and sixth contents being different.

6. The structure of claim 5,
    wherein the third comparing circuit comprises a third exclusive-NOR circuit.

7. The structure of claim 6, further comprising a fourth coupling via,
    wherein the first semiconductor chip further comprises a seventh latch in the first functional circuit,
    wherein the second semiconductor chip further comprises an eighth latch in the second functional circuit,
    wherein the first semiconductor chip further comprises a fourth comparing circuit electrically connected to the seventh latch,
    wherein the fourth coupling via electrically connects the eighth latch of the second semiconductor chip to the fourth comparing circuit of the first semiconductor chip, and
    wherein the fourth comparing circuit is configured to:
        (i) receive a seventh content of the seventh latch directly,
        (ii) receive an eighth content of the eighth latch indirectly through the fourth coupling via, and
        (iii) compare the seventh and eighth contents and assert a fourth mismatch signal in response to the seventh and eighth contents being different.

8. The structure of claim 7,
    wherein the fourth comparing circuit comprises a fourth exclusive-NOR circuit.

9. The structure of claim 1, further comprising a third semiconductor chip,
    wherein the second semiconductor chip is on top of and bonded to the third semiconductor chip, and
    wherein the third semiconductor chip includes a ninth latch.

10. The structure of claim 9,
    wherein the second semiconductor chip further comprises a voting logic electrically coupled to the first latch, the second latch, and the ninth latch, and
    wherein the voting logic is configured to output a majority content of three contents of the first latch, the second latch, and the ninth latch.

11. A semiconductor structure operation method, comprising
    providing a semiconductor structure which includes:
        (a) a first semiconductor chip and a second semiconductor chip, wherein the first semiconductor chip is on top of and bonded to the second semiconductor chip, wherein the first semiconductor chip comprises a first functional circuit including a first latch, wherein the second semiconductor chip comprises a second functional circuit including a second latch, wherein the first and second functional circuits are functionally identical, and wherein the second semiconductor chip further comprises a first comparing circuit electrically connected to the second latch, and (b) a first coupling via electrically connecting the first latch of the first semiconductor chip to the first comparing circuit of the second semiconductor chip; and using the first comparing circuit to:

(a) receive a second content of the second latch directly, (b) receive a first content of the first latch indirectly through the first coupling via, and (c) compare the first and second contents and assert a first mismatch signal in response to the first and second contents being different.

12. The operation method of claim 11, further comprising using a second comparing circuit to:

(a) receive a fourth content of a fourth latch in the second functional circuit directly, (b) receive a third content of a third latch in the first functional circuit indirectly through a second coupling via, and (c) using the second comparing circuit to compare the third and fourth contents and assert a second mismatch signal in response to the third and fourth contents being different, wherein the second semiconductor chip further comprises the second comparing circuit, wherein the second coupling via electrically connects the fourth latch of the first semiconductor chip to the second comparing circuit of the second semiconductor chip, wherein the first comparing circuit comprises a first exclusive-NOR circuit, and wherein the second comparing circuit comprises a second exclusive-NOR circuit.

* * * * *